United States Patent
Li

(10) Patent No.: US 8,332,175 B2
(45) Date of Patent: Dec. 11, 2012

(54) OSCILLOSCOPE PROBE CALIBRATING SYSTEM

(75) Inventor: Hui Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 305 days.

(21) Appl. No.: 12/857,499

(22) Filed: Aug. 16, 2010

(65) Prior Publication Data

US 2011/0320159 A1    Dec. 29, 2011

(30) Foreign Application Priority Data

Jun. 24, 2010   (CN) .......................... 2010 1 0208825

(51) Int. Cl.
*G01R 35/00* (2006.01)
(52) U.S. Cl. ........ 702/105; 702/894; 702/194; 702/107; 324/646; 324/76.19; 324/601; 324/74; 324/121 R; 324/404; 324/123 R
(58) Field of Classification Search .................... 702/85, 702/89, 105, 104, 106, 107, 116, 94, 97; 324/642, 646, 76.19, 601, 74, 121 R, 404, 324/123 R
See application file for complete search history.

(56) References Cited

U.S. PATENT DOCUMENTS

| | | | | |
|---|---|---|---|---|
| 3,656,053 A * | 4/1972 | Richman | ....................... | 324/404 |
| 3,836,852 A * | 9/1974 | Ross | ........................ | 324/123 R |
| 4,608,657 A * | 8/1986 | Manome et al. | ................ | 702/89 |
| 5,184,062 A * | 2/1993 | Ladwig | .......................... | 324/74 |
| 5,272,449 A * | 12/1993 | Izawa | ................................ | 330/2 |
| 6,801,042 B2 * | 10/2004 | Mc Pherson et al. | ......... | 324/601 |
| 7,271,575 B2 * | 9/2007 | Pickerd et al. | ............. | 324/76.19 |
| 2004/0027138 A1 * | 2/2004 | Pickerd et al. | ................ | 324/646 |
| 2007/0050170 A1 * | 3/2007 | Noguchi et al. | ............. | 702/127 |

* cited by examiner

*Primary Examiner* — Carol Tsai
(74) *Attorney, Agent, or Firm* — Altis Law Group, Inc.

(57) ABSTRACT

An oscilloscope probe calibrating system for a single terminal probe and a differential probe includes an oscilloscope, a main branch module, a sub-branch module, and a resistor. The oscilloscope includes multiple inputs for receiving signals from the single terminal probe and the differential probe, an output for outputting an original calibration signal, and a display module displaying the waveforms of the original calibration signal and the signals from the single terminal probe and the differential probe. The main branch module converts the original calibration signals to a number of first calibration signals. The sub-branch module converts the first calibration signals to a number of second calibration signals. The sub-branch module includes a single terminal sub-branch module and a differential sub-branch module coupled to the main branch module. One end of the resistor is connected between the main branch module and the differential sub-branch module, and the other end is grounded.

12 Claims, 2 Drawing Sheets

OSCILLOSCOPE PROBE CALIBRATING SYSTEM

BACKGROUND

1. Technical Field

The present disclosure generally relates to calibrating systems and, particularly, to an oscilloscope probe calibrating system.

2. Description of Related Art

Amplitude and timing calibrating technology is generally used to calibrate oscilloscope probes, in order to ensure the input amplitude of the probe is kept the same with the output amplitude, and all of the timings of different probes are in consistent with each other. However, when in calibrating a differential probe, a positive signal and a negative signal are input to the oscilloscope, thus the amplitude of the output signal from the probe is accumulated. As a result, it is not easy to distinguish the difference between the amplitude of the input signal and that of the output signal from the probe, thus reducing the precision of the oscilloscope.

Therefore, it is desirable to provide an oscilloscope probe calibrating system, which can overcome the problems described above.

DETAILED DESCRIPTION

Figure 1:
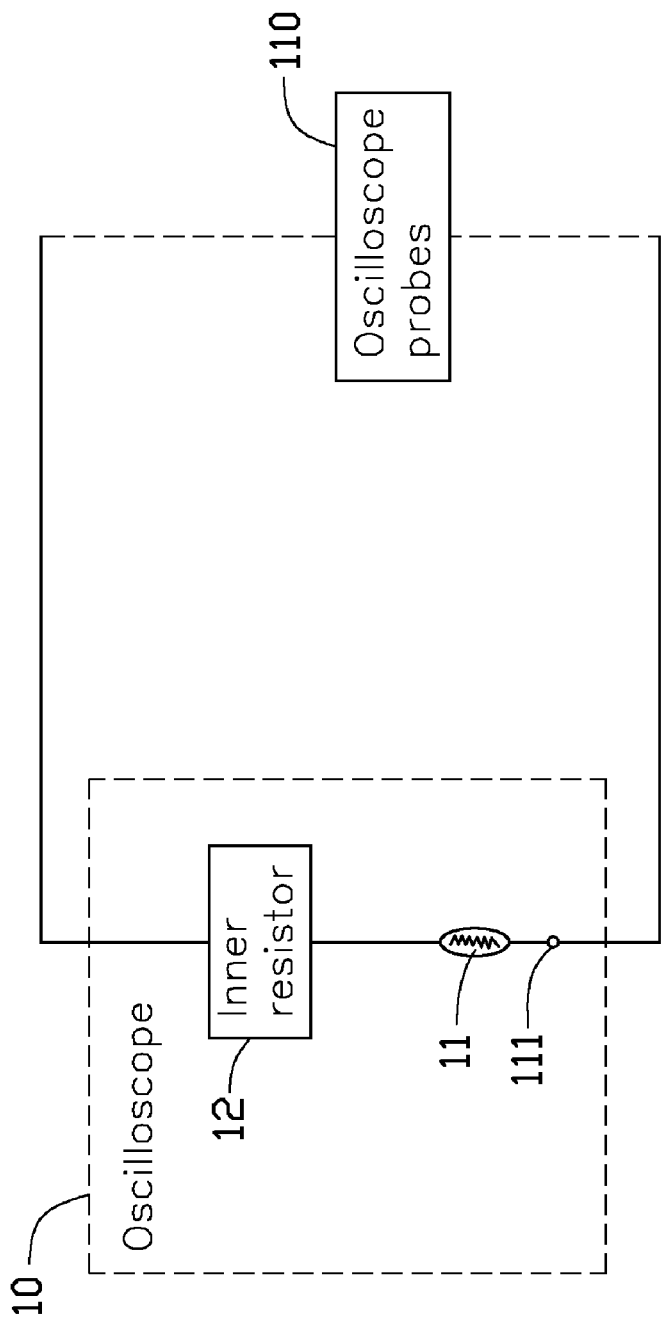
FIG. 1 is a simplified schematic circuit diagram for showing the fundamental principles of an oscilloscope probe calibrating system, according to an exemplary embodiment.
Figure 2:
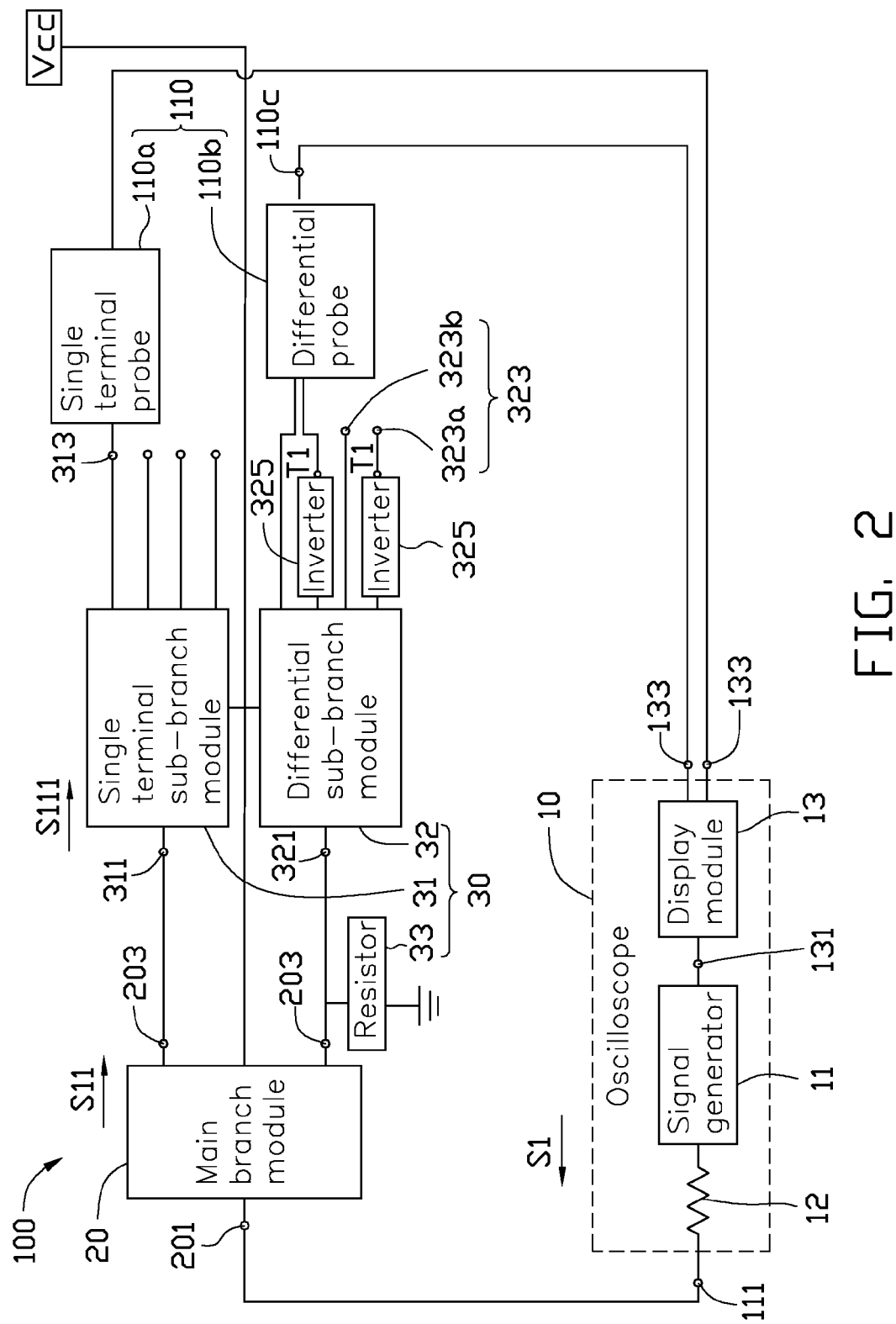
FIG. 2 is a schematic circuit diagram of the oscilloscope probe calibrating system of FIG. 1.

Referring to FIGS. 1 and 2, an oscilloscope probe calibrating system 100, in accordance with the disclosure, is shown, configured for calibrating the signal amplitudes and the timings of different oscilloscope probes 110.

In the present embodiment, the oscilloscope probes 110 include a single terminal probe 110a and a differential probe 110b. The sum of the inner resistance of the single terminal probe 110a and the differential probe 110b is 1 MΩ.

The system 100 includes an oscilloscope 10, a main branch module 20, a sub-branch module 30, and a power supply Vcc. The main branch module 20 is connected to the output of the oscilloscope 10. The sub-branch module 30 is connected to the output of the main branch module 20.

The oscilloscope 10 includes a signal generator 11, an inner resistor 12, and a display module 13. The signal generator 11 includes an output terminal 111 to output an original calibration signal S1 with an amplitude U. The inner resistor 12 is connected to the signal generator 11 in series. In the present embodiment, the inner resistor 12 is 50Ω. The display module 13 includes a first input terminal 131 connected to the signal generator 11 for inputting the signals from the signal generator 11, and a number of second input terminals 133 for receiving signals from the single terminal probe 110a and the differential probe 110b. The display module 13 displays all of the signals from the first input terminal 131 and from the second input terminals 133 in the present embodiment. In some other embodiments, the display module 13 may display only the signals from the second input terminals 133.

The main branch module 20 includes an input terminal 201, and two output terminals 203. The input terminal 201 is coupled to the output terminal 111 of the oscilloscope 10. The main branch module 20 is configured for receiving the original calibration signal S1 from the signal generator 11, and converting the original calibration signal S1 into a number of first calibration signals S11 with the same amplitudes at U.

The sub-branch module 30 is configured for receiving the first calibration signals S11 from the main branch module 20, and converting the first calibration signals S11 into a number of second calibration signals S111 with the same amplitudes also at U.

The sub-branch module 30 includes a single terminal sub-branch module 31, a differential sub-branch module 32, and a resistor 33. The single terminal sub-branch module 31 includes an input terminal 311 coupled to one of the output terminals 203 of the main branch module 20, and at least one single terminal positive output terminal 313. The differential sub-branch module 32 includes an input terminal 321 coupled to the other output terminal 203 of the main branch module 20, and at least one pair of differential output terminals 323. The pair of differential output terminals 323 includes a negative output 323a and a positive output 323b. The negative output 323a may be achieved by coupling an inverter 325 to a positive output. One end of the resistor 33 is connected between the main branch module 20 and the differential sub-branch module 32, the other end of the resistor 33 is grounded. The resistor 33 is 50Ω, same as the inner resistor 12 of the oscilloscope 10. It is understood that the resistor 33 of the sub-branch module 30 also can be more than or less than 50Ω, but is consistent with that of the inner resistor 12 of the oscilloscope 10.

The power supply Vcc is electrically connected to the main branch module 20 and the sub-branch module 30, for supplying power thereto.

When calibrating amplitudes of signals through the single terminal probe 110a, one end of the single terminal probe 110a is connected to one of the single terminal positive output terminals 313 of the single terminal sub-branch module 31, the other end of the single terminal probe 110a is connected to the first input terminal 133 of the display module 13. The original calibration signal S1 from the signal generator 11 is converted into the first calibration signals S11 by the main branch module 20. Simultaneously, the first calibration signals S11 is further converted into the second calibration signal S111 by the single terminal sub-branch module 31. Then, the second calibration signal S111 is output to the oscilloscope 10. In the present embodiment, due to a direct connection between the single terminal sub-branch module 31 and the main branch module 20, the amplitude of the second calibration signal S111 is kept at U. The display module 13 displays the waveforms of the original calibration signal S1 and the second calibration signal S111 at the same time and using the same scale. According to a comparison result of the amplitudes of the original calibration signal S1 and the second calibration signal S111, a judgment can be made as to whether or not to, and/or how much to, adjust the amplitude of the second calibration signal S111.

When calibrating the amplitudes of signals through the differential probe 110b, one end of the differential probe 110b is connected to one of the differential output terminals 323 of the differential sub-branch module 32, the other end of the differential probe 110b is connected to the first input terminal 133 of the display module 13. In detail, the differential probe 110b includes a positive input (not labeled) coupled to the positive output 323b, a negative input (not labeled) coupled to the negative output 323a, and an output 110c coupled to the first input terminal 133 of the display module 13. As such, the original calibration signal S1 from the signal generator 11 is converted into the first calibration signals S11 through the main branch module 20. One of the first calibration signals S11 is further converted into the second calibration signals S111 through the differential sub-branch module 32 and inverted to be a negative output signal by the inverter 325. Due to the resistance of the resistor 33 being equal to that of the inner resistor 12 of the oscilloscope 10, the output amplitude of the second calibration signal S111 from the positive input 323b is divided to be U/2, while the output amplitude of the second calibration signal S111 from the negative input 323a is divided to be (−U/2). As such, in theory, the output amplitude difference of the second calibration signal S111 from the differential probe 110b is U, equaling |U/2| plus |−U/2|. The display module 13 displays the waveforms of the original calibration signal S1 and the second calibration signal S111 at the same time and using the same scale. According to a comparison result of the amplitudes of the original calibration signal S1 and the second calibration signal S111, a judgment can be made as to whether or not to, and/or how much to, adjust the amplitude of the second calibration signal S111.

When calibrating the timings of the single terminal probe 110a and that of the differential probe 110b, the single terminal probe 110a is connected to the third output terminals 313 of the first sub-branch module 31, while the differential probe 110b is connected to the fourth output terminals 323 of the second sub-branch module 32. The original calibration signal S1 from the signal generator 11 is converted into the first calibration signals S11, and further converted into the second calibration signals S111 through the single terminal probe 110a and the differential probe 110b, and feed back to the oscilloscope 10 at last. Similar to the above calibrating process, the display module 13 displays the waveforms of the second calibration signal S111 output from the single terminal probe 110a and that from the differential probe 110b, at the same time and using the same scale. According to a comparison result of the starting time of the waveforms, a judgment can be made as to whether or not to and/or how much to adjust the timings of the second calibration signals S111 from the single terminal probe 110a and the differential probe 110b.

It is understood that the main branch module 20 also can be connected to a number of sub-branch modules 30, for calibrating the other types of oscilloscope probes such as a subminiature version P (SMP) or a subminiature version A (SMA), with the same theory.

While various exemplary and preferred embodiments have been described, it is to be understood that the disclosure is not limited thereto. To the contrary, various modifications and similar arrangements (as would be apparent to those skilled in the art) are likewise intended to be covered. Therefore, the scope of the appended claims should be accorded the broadest interpretation to encompass all such modifications and similar arrangements.

What is claimed is:

1. An oscilloscope probe calibrating system for a single terminal probe and a differential probe, comprising:
    an oscilloscope comprising a plurality of inputs for receiving signals from the single terminal probe and the differential probe, an output for outputting an original calibration signal, and a display module displaying the waveforms of the original calibration signal and the signals from the single terminal probe and the differential probe;
    a main branch module coupled to the output of the oscilloscope for converting the original calibration signals into at least one first calibration signals;
    a sub-branch module configured for converting the first calibration signals into at least one second calibration signals, the sub-branch module comprising a single terminal sub-branch module coupled to one output of the main branch module, and a differential sub-branch module coupled to another output of the main branch module; and
    a resistor disposed with one end connected between the main branch module and the differential sub-branch module, and the other end grounded.

2. The oscilloscope probe calibrating system of claim 1, wherein the single terminal probe is connected to the output of the single terminal sub-branch module, and the differential probe is connected to the output of the differential sub-branch module.

3. The oscilloscope probe calibrating system of claim 1, further comprising a power supply for supplying power to the main branch module and the sub-branch module.

4. The oscilloscope probe calibrating system of claim 1, wherein the oscilloscope further comprises a signal generator and an inner resistor, the signal generator is configured for outputting the original calibration signal, the inner resistor is connected to the signal generator in series.

5. The oscilloscope probe calibrating system of claim 4, wherein the display module comprises a first input terminal connected to the signal generator for inputting the signals from the signal generator and a plurality of second input terminals for receiving signals from the single terminal probe and the differential probe.

6. The oscilloscope probe calibrating system of claim 4, wherein the resistance of the inner resistor is the same as that of the resistor of the sub-branch module.

7. The oscilloscope probe calibrating system of claim 1, wherein the single terminal sub-branch module comprises at least one positive output terminal connected to the single terminal probe.

8. The oscilloscope probe calibrating system of claim 1, wherein the differential sub-branch module comprises at least one pair of differential output terminals connected to the differential probe.

9. The oscilloscope probe calibrating system of claim 8, wherein the pair of differential output terminals comprise a negative output and a positive output.

10. The oscilloscope probe calibrating system of claim 9, further comprising an inverter coupled to a positive output to achieve the negative output.

11. The oscilloscope probe calibrating system of claim 1, wherein the display module displays the waveforms of the original calibration signal and the second calibration signal at the same time and using the same scale.

12. An oscilloscope probe calibrating system for a single terminal probe and a differential probe, comprising:
    an oscilloscope comprising a plurality of inputs for receiving signals from the single terminal probe and the differential probe, an output for outputting an original calibration signal, and a display module displaying the waveforms of the original calibration signal and the signals from the single terminal probe and the differential probe;
    a main branch module coupled to the output of the oscilloscope for converting the original calibration signals into a plurality of first calibration signals; and
    a sub-branch module configured for converting the first calibration signals into a plurality of second calibration signals, the sub-branch module comprising a single terminal sub-branch module coupled to one output of the main branch module, a differential sub-branch module coupled to another output of the main branch module, and a resistor disposed with one end connected between the main branch module and the differential sub-branch module and the other end grounded.

* * * * *